(12) United States Patent
Lui et al.

(10) Patent No.: US 6,528,830 B1
(45) Date of Patent: Mar. 4, 2003

(54) THIN FILM TRANSISTOR

(75) Inventors: Basil Lui, Cambridge (GB); Piero Migliorato, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/914,926

(22) PCT Filed: Jan. 2, 2001

(86) PCT No.: PCT/GB01/00002

§ 371 (c)(1),
(2), (4) Date: Dec. 13, 2001

(87) PCT Pub. No.: WO01/06564

PCT Pub. Date: Jul. 12, 2001

(51) Int. Cl.$^7$ .............................................. H01L 31/072
(52) U.S. Cl. .......................... 257/200; 438/30; 438/50; 438/150; 438/486
(58) Field of Search ........................... 438/30, 50, 149, 438/150, 151, 166

(56) References Cited

U.S. PATENT DOCUMENTS

| | | | |
|---|---|---|---|
| 4,106,045 A | 8/1978 | Nishi | ............................ 357/23 |
| 5,420,055 A | 5/1995 | Vu et al. | |
| 5,956,579 A | 9/1999 | Yamazaki et al. | ........... 438/151 |
| 5,985,741 A | * 11/1999 | Yamazaki et al. | ........... 438/166 |
| 6,358,766 B1 | * 3/2002 | Kasahara | ..................... 438/149 |

FOREIGN PATENT DOCUMENTS

| | | |
|---|---|---|
| EP | 0 735 592 A2 | 10/1996 |
| JP | A 55-140270 | 11/1980 |
| JP | A 57-99778 | 6/1982 |
| JP | A 62-104172 | 5/1987 |
| JP | A 63-114265 | 5/1988 |
| JP | A 02-178965 | 7/1990 |
| JP | A 08-316487 | 11/1996 |
| JP | A 10-12886 | 1/1998 |
| WO | WO 96/17385 | 6/1996 |
| WO | WO 97/06564 | 2/1997 |
| WO | WO 99/30369 | 6/1999 |

* cited by examiner

*Primary Examiner*—David Nelms
*Assistant Examiner*—Mai-Huong Tran
(74) *Attorney, Agent, or Firm*—Oliff & Berridge, PLC

(57) ABSTRACT

A semiconductor transistor comprising a substrate having an active layer formed thereon, a source and a drain formed in the active layer, a gate insulating layer formed on the active layer and a gate electrode formed on the insulating layer, wherein the active layer has at least one recombination center which is located between the source and the drain and which extends from the substrate side through the active layer for less than the full depth thereof. The transistor can be fabricated by depositing the recombination centers on the substrate prior to depositing the active layer or by other methods such as diffusing material from the substrate side into the active layer.

11 Claims, 5 Drawing Sheets

THIN FILM TRANSISTOR

BACKGROUND OF THE INVENTION

1. Field of Invention

The present invention relates to semiconductor transistors and has particular application to thin film polycrystaline transistors.

2. Description of Related Art

Herein the abbreviation $I_D$ is used to refer to the transistor drain current, $V_G$ is used to refer to the transistor gate voltage generally, $V_{DS}$ is used to refer to the transistor drain to source voltage, and $V_{GS}$ is used to refer to the transistor gate to source voltage. Furthermore, herein the word "on", such as in the description of one film or layer being "formed on another" is not intended to require direct contact between the two layers. That is, for example, it should not be interpreted as excluding arrangements in which another layer or film is interposed between the one layer which is formed "on" the other.

Unlike the output characteristics ($I_D V_{DS}$) of single crystal MOSFETs, a saturation regime is not observed, for example, in a polycrystaline silicon thin film transistor. Instead, as shown in FIG. 1, when the device is operating above the so-called pinch-off level, generally when $V_{DS} > V_{GS}$, high electric fields are formed near the drain and this results in so-called impact ionisation. The result is an increase in drain current $I_D$ which is often referred to as the kink effect. This effect increases power dissipation and degrades the switching characteristics in digital circuits, whilst reducing the maximum obtainable gain as well as the common mode rejection ratio in analogue circuits.

The kink effect is also affected by the so-called parasitic bipolar effect, which is well known in silicon-on-insulator (SOI) devices. This occurs when electron-hole pairs are generated with impact ionisation at high electric fields near the drain, resulting in the holes drifting towards the source and causing a potential barrier lowering at the source junction. This effect also occurs in polysilicon thin film transistors and is due to the fact that the thin film active layer acts as the base of a bipolar transistor.

SUMMARY OF THE INVENTION

Against this background and with a view to providing an improved semiconductor transistor, in a first aspect the present invention provides a semiconductor transistor comprising a substrate having an active layer formed thereon, a source and a drain formed in the active layer, a gate insulating layer formed on the active layer and a gate electrode formed on the insulating layer, wherein the active layer has at least one centre which is located between the source and the drain and which extends ate side through the active layer for less than the full depth thereof.

BRIEF DESCRIPTION OF THE DRAWINGS

According to a second aspect of the present invention there is provided a method of manufacturing a semiconductor transistor according to the first aspect of the invention.

Embodiments of the present invention will now be described in more detail and by way of further example only with reference to the accompanying drawings, in which.

DETAILED DESCRIPTION OF EXEMPLARY EMBODIMENTS

Figure 1:
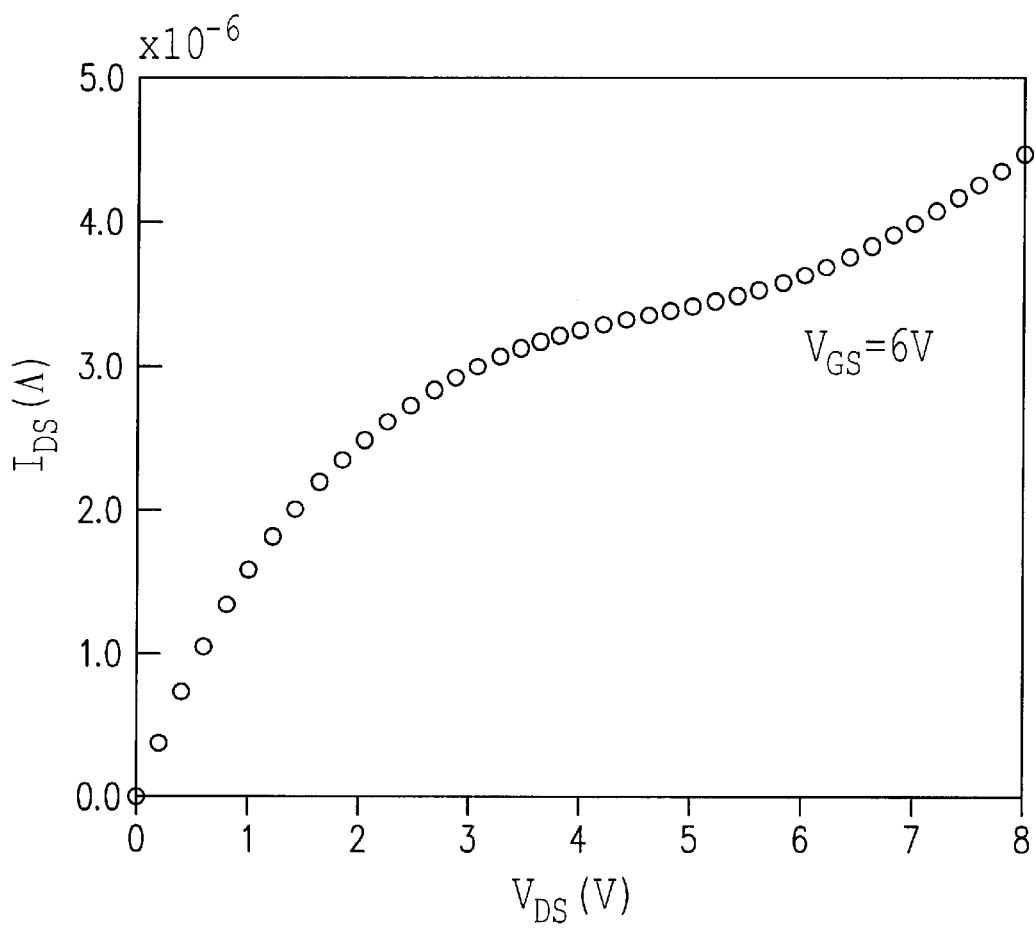
FIG. 1 illustrates the $I_D$-$V_{DS}$ output characteristic of a conventional polycrystaline silicon thin film transistor.
Figure 2A:
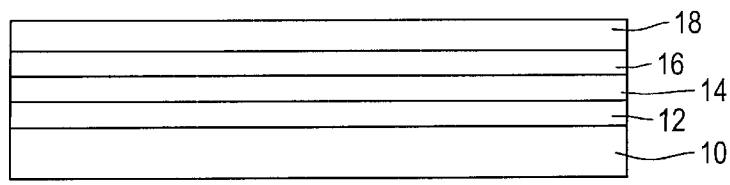
FIGS. 2(a)–2(f) illustrate the processing steps for forming a gate overlapped lightly doped drain device.
Figure 2B:
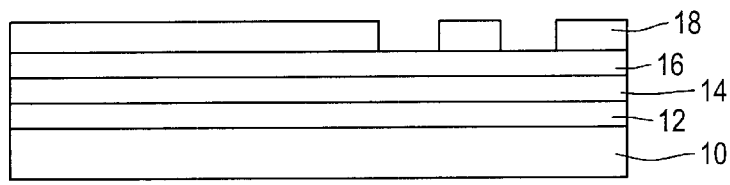
Figure 2C:
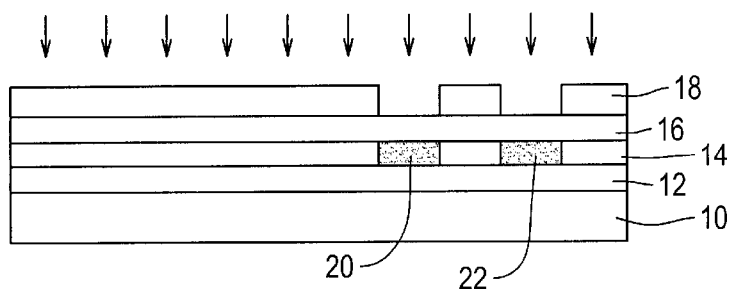
Figure 2D:
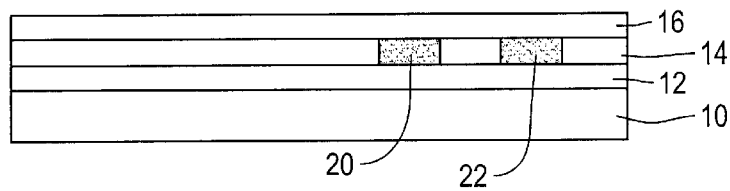
Figure 2E:
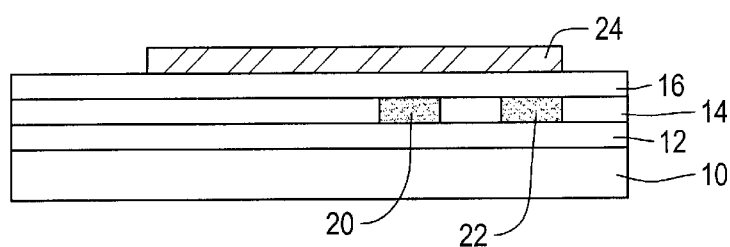
Figure 2F:
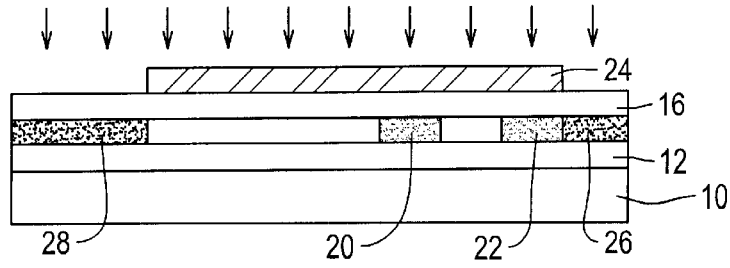

The formation of a gate overlapped lightly doped drain transistor will now be described with reference to FIG. 2. First, as shown in FIG. 2(a), a basic layered arrangement of: a substrate 10, a buffer oxide layer 12, an active layer of silicon 14, a gate oxide layer 16, and a mask 18 are built up in that order using known techniques. The mask layer 18 is then patterned as shown in FIG. 2(b). That is, two openings are formed in the mask such that ion implantation can be effected to form two lightly doped regions, 20 and 22, in the active layer 14; as shown in FIG. 2(c). Next the mask layer 18 is removed, as shown in FIG. 2(d). A metal is then deposited and patterned so as to form the gate electrode 24, as shown in FIG. 2(e). As shown in FIG. 2(e), the rightmost end of the gate electrode 24 is approximately aligned with the rightmost end of the lightly doped region 22. A further stage of implantation is then performed, as shown in FIG. 2(f), so as to form the heavily doped drain 26 and souece 28 of the transistor using the gate electrode as a mask. Thus, in the final device, the gate 24 overlaps the lightly doped region 22 which forms part of the drain.

The structure shown in FIG. 2(f) has a two part drain, regions 22 and 26, and a recombination region 20. The lightly doped part of the drain, region 22, reduces the kink effect by reducing the electric field, and hence impact ionisation, near the drain. In addition, the recombination region 20 suppresses the parasitic bipolar effect by reducing the number of holes which reach the source. These advantages are significant. However, it has been found that the structure illustrated in FIG. 2(f) has a significant disadvantage in that a large gate-to-drain capacitance is established by virtue of the topography used to achieve the stated advantages.

Figure 3A:
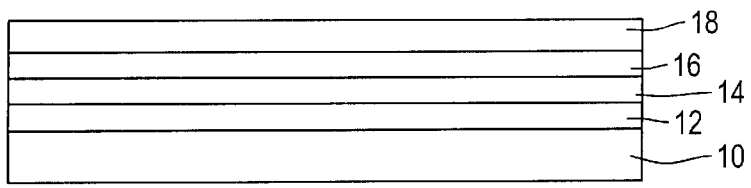
FIGS. 3(a)–3(f) illustrate the process steps for forming a split gate non-overlapped device.
Figure 3B:
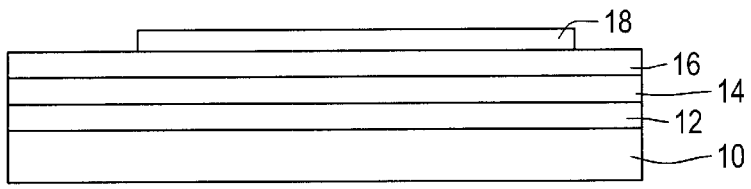
Figure 3C:
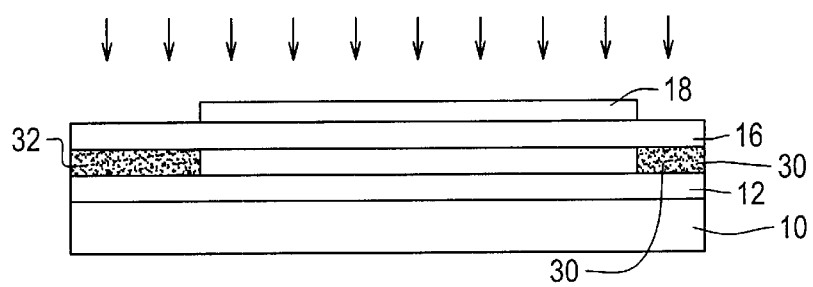
Figure 3D:
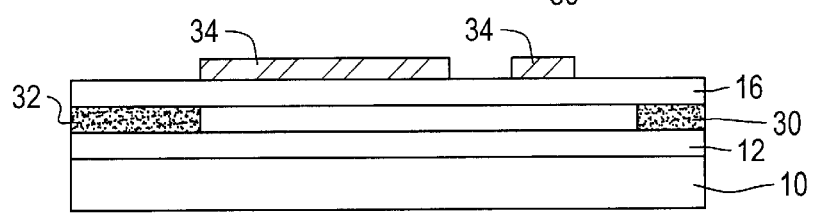
Figure 3E:
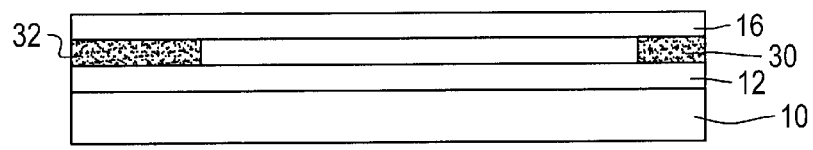
Figure 3F:
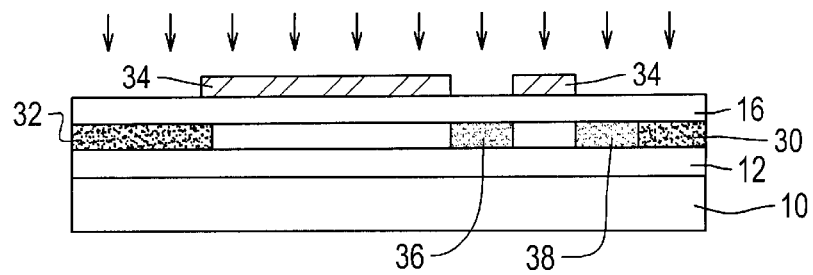

The main processing steps for the formation of a transistor having a non-overlapped gate will now be described with reference to FIG. 3. As shown in FIG. 3(a), the starting position is the same as with the device described with reference to FIG. 2(a). Thus, the same reference numerals are used and the description thereof will not be repeated. In this arrangement, however, the mask layer 18 is patterned in a different formation; as shown in FIG. 3(b). Also, the next step is ion implantation to produce the heavily doped regions 30 and 32 in the active layer 14; as shown in FIG. 3(c). These heavily doped regions 30 and 32 form the drain (part of) and source, respectively, of the final transistor. The mask layer 18 is removed, as shown in FIG. 3(d) and then a metal layer is deposited and patterned so as to form the gate electrode 34; as shown in FIG. 3(e). As shown in FIG. 3(e), the gate electrode is split and the leftmost end of the gate electrode is aligned with the rightmost end of the source. The rightmost end of the gate electrode is not aligned with the leftmost end of the heavily doped region 30 but stops short thereof. Thus, the gate electrode is used as a mask for ion implantation to form two lightly doped regions 36 and 38; as shown in FIG. 3(f). The lightly doped region 36 is, of course, thus aligned with the split in the gate electrode and the lightly doped region 38 abuts the heavily doped region 30, so that regions 30 and 38 constitute the drain of the transistor. As will be readily apparent from this description and from FIG. 3(f), in this structure the gate does not overlap the drain. In operation, the split parts of the gate would normally have the same voltage applied to them.

The arrangement shown in FIG. 3(f) retains the advantages of the recombination centre and lightly doped drain of the structure shown in FIG. 2(f). However, as already noted, this arrangement does not have the gate overlapping the drain. In fact, they are self aligned so that they do not overlap. The result is significantly to reduce the gate-drain capacitance which degrades the performance of the structure illustrated in FIG. 2(f).

Figure 4A:
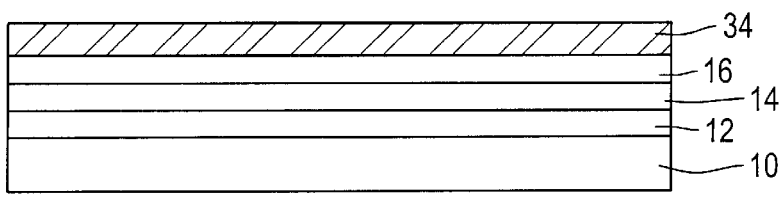
FIGS. 4(a)–4(c) illustrate the process steps for forming another split gate non-overlapped device.
Figure 4B:
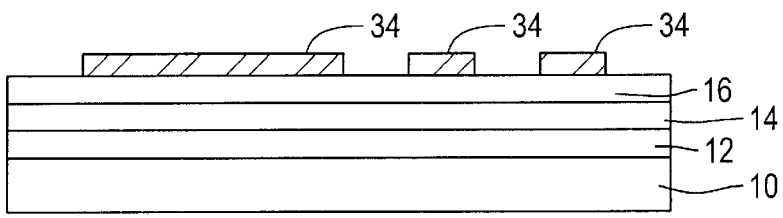
Figure 4C:
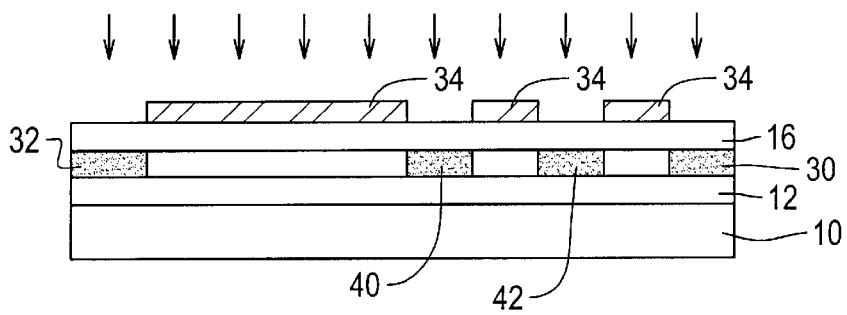

Another non-overlapped gate transistor is illustrated in FIG. 4. Unlike the starting arrangements shown in FIGS. 2(a) and 3(a), in this arrangement the mask layer 18 is not provided but instead the metal layer 34 to form the gate electrode is first formed on the gate oxide layer 16. This is shown in FIG. 4(a). Next the metal layer is patterned to form a multiple split gate electrode 34, as shown in FIG. 4(b). It is to be noted that in the FIG. 3 arrangement a single split is formed in the gate whereas in this arrangement multiple splits are formed, with two such splits being shown. As illustrated in FIG. 4(c), the multiple split gate electrode is used as a mask for ion implantation to form heavily doped regions 30, 32, 40 and 42 in the active layer 14. The heavily doped regions 30 and 32 do, of course, form the drain and source respectively and the heavily doped regions 40 and 42 are two recombination centres, which act in a similar manner to the recombination centres 20 and 36 shown in FIGS. 2 and 3.

It will be immediately apparent that the number of processing steps in the arrangement of FIG. 4 is significantly reduced compared with the fabrication processes illustrated in FIGS. 2 and 3. Moreover, the whole structure is self aligned and the advantages of the FIGS. 2(f) and 3(f) structures are retained. Indeed, the suppression of the kink effect and the parasitic bipolar effect are enhanced due to the presence of multiple recombination centres, ie regions 40 and 42.

In each of the structures shown in FIGS. 2(f), 3(f) and 4(c) the respective recombination centres are formed by ion implantation through the gate oxide layer (16) and extend through the entire depth of the active layer (14). Difficulties can arise with such structures. Firstly, damage is often caused to the gate oxide layer during the ion implantation process used to form the recombination centres. Secondly, the fabrication processes limit the range of ion implantation materials which can be used. Thirdly, the "length" of the active layer is increased. These difficulties can be avoided by adopting the embodiment of the present invention illustrated in FIG. 5.

Figure 5A:
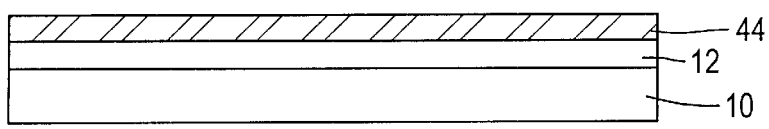
FIGS. 5(a)–5(g) illustrate the process steps for forming a transistor according to an embodiment of the present invention.
Figure 5B:
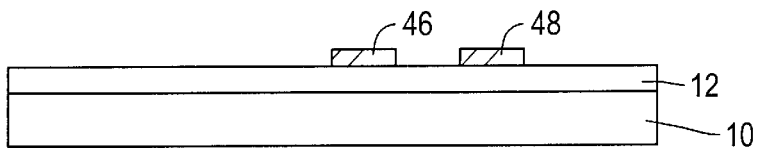
Figure 5C:
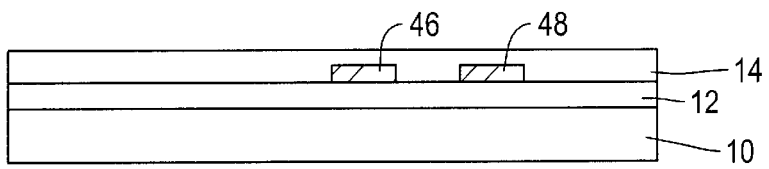
Figure 5D:
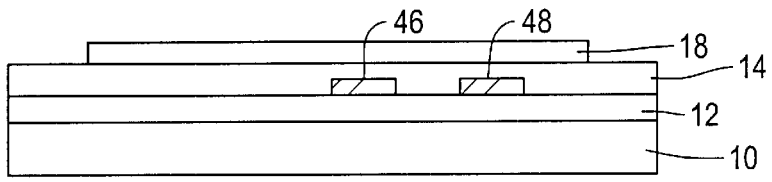
Figure 5E:
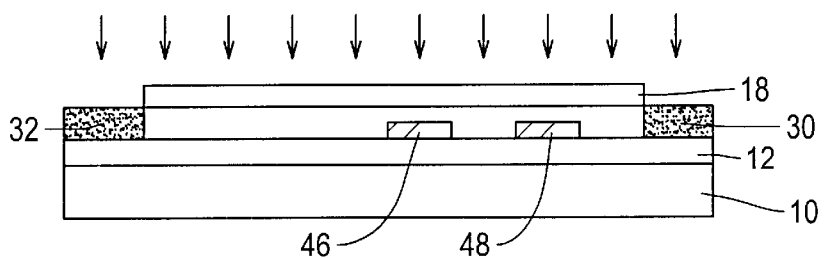
Figure 5F:
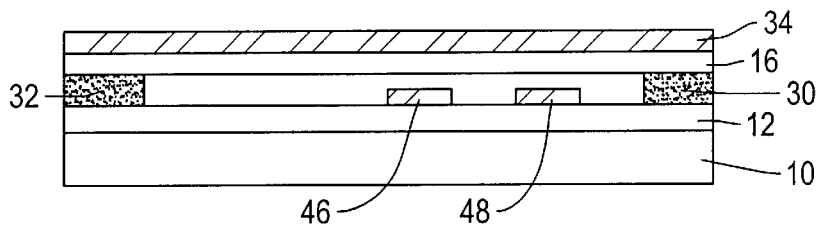
Figure 5G:
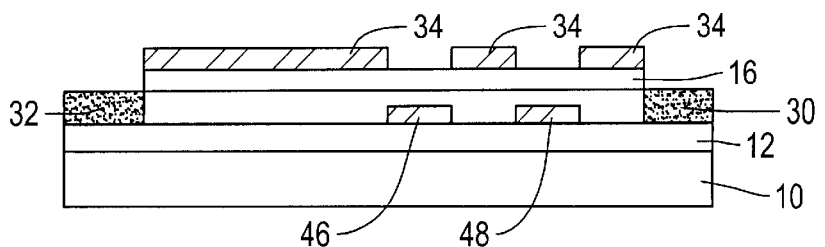

As illustrated in FIG. 5(a), the embodiment of the present invention is formed by depositing a buffer oxide layer 12 on a substrate 10 and then depositing a metal layer 44 on the buffer oxide 12. The metal layer 44 is etched so as to leave two metal regions 46 and 48, as shown in FIG. 5(b). Next the semiconductor active layer 14 is deposited over the metal regions and the remainder of the buffer oxide 12, as shown in FIG. 5(c). A mask material 18 is deposited and etched, as shown in FIG. 5(d). As shown in FIG. 5(e), the mask 18 is used in ion implanting the source and drain regions, 32 and 30 respectively, in the active layer 14. Subsequently, the mask 18 is removed and a gate oxide 16 is deposited over the active layer 14. A metal layer 34 is deposited over the gate oxide 16, as shown in FIG. 5(f). The metal layer 34 and gate oxide 16 are etched so as to result in the final structure shown in FIG. 5(g). As seen in FIG. 5(g), a multiple-split gate electrode 34 is formed with the splits approximately aligned with the metal regions 46 and 48. Also, the gate is non-overlapping with the drain. Of course, the fabrication process illustrated in FIG. 5 could be modified if desired so as to result in a gate/drain overlapped structure.

The metal regions 46 and 48 act as recombination centres for reducing the number of holes travelling to the source from the area next to the drain, in the same manner as described above. It will be appreciated that the various advantages discussed above with respect to the relevant features are obtained by the embodiment of the present invention. It will further be appreciated that damage to the gate oxide by ion implantation in formation of the source and drain is avoided. The range of materials which can be deposited to form the recombination centres 46 and 48 is very much less restricted than the materials which can form the recombination centres 20,22; 36,38 and 40,48. The use of a metal to form recombination centres 46 and 48 has been described, but other material can be used. As described and illustrated, the recombination centres do not extend through the whole thickness of the active layer. As a result, the introduction of a series resistance in the active layer between the source and the drain is avoided and the 'length' of the active layer is thus not increased. Moreover, a thin active layer can be achieved between source and drain, which improves the driving current. That is, as the active layer becomes thinner, a point is reached at which there is insufficient active layer thickness for complete band bending to occur. This corresponds to less charge being trapped in defects and the resulting increase in free charge improves the drain current. Also, the thicker active layer region just besides the drain matches the drain junction depth and serves to decrease the lateral electric field. This reduces impact ionisation and thus the kink effect.

The depositing of the material for the recombination centres 46 and 48 has been described. However, other methods of establishing the recombination centres 46 and 48 can be used. For example, the recombination centres can be established by diffusing material from the substrate side or even, given the right materials and limited damage, ion implantation from the substrate side.

The fabrication of two recombination centres 46 and 48 has been described and illustrated. However, the number is not limited to two. One centre can be provided, or more than two. The extent of the recombination centre or centres in the thickness direction of the active layer 14 can vary from the minimum depth which it is possible to form (ie as close to zero as can be achieved) up to almost the full thickness of the active layer.

In the structure illustrated in FIG. 5(g), the length of the active layer between the source and the drain (ie the channel length) may typically be between 0.2 $\mu$m and 100 $\mu$m, inclusive. The length of the recombination centres may typically be between 0.02 $\mu$m and 2 $\mu$m, inclusive. The distance between the-recombination centre near the drain and the drain itself may typically be between 0.02 $\mu$m and 2 $\mu$m inclusive and the distance between the recombination centres may typically be between 0.02 $\mu$m and 2 $\mu$m. From this discussion of typical dimensions it will be appreciated, inter alia, that the split gate structure of the FIG. 5 (as well as those of FIGS. 3 and 4) differs from known split gate devices since the known split gate devices have the splits evenly spaced in large dimensions across the length of the device. In this comparison reference is only being made to the gate electrode and the known split gate devices referred to have otherwise conventional structures in contrast to the recombination centres and lightly doped drains described herein.

The active thin film material may be an amorphous, polycrystalline or single crystal semiconductor material.

The devices described with reference to FIGS. 3, 4 and 5 provide suppression of the kink effect by reducing the electric field and the impact ionisation near the drain. They suppress the parasitic bipolar effect by reducing the number of generated holes reaching the source as a result of provision of the recombination centres spaced from the drain.

What is claimed is:

1. A semiconductor transistor comprising:
   a substrate having an active layer formed thereon, a source and a drain formed in the active layer,
   a gate insulating layer formed on the active layer, and
   a gate formed on the insulating layer,
   wherein the active layer has at least one recombination centre which extends from the substrate side through the active layer for less than the full depth thereof and which is located between the source and the drain at a position spaced from the drain arranged to intercept, in operation of the transistor, minority carriers generated in the active layer next to the drain.

2. A semiconductor transistor as claimed in claim 1, wherein the recombination centre is formed of a metal.

3. A semiconductor transistor as claimed in claim 2, wherein the gate is a multiply-split gate and the active layer has a plurality of recombination centres which are located between the source and the drain and each aligned with a respective split in the gate electrode.

4. A semiconductor transistor as claimed in claim 2, wherein the recombination centre or centres are nearer to the drain than they are to the source.

5. A semiconductor transistor as claimed in claim 1, wherein the gate is a multiply-split gate and the active layer has a plurality of recombination centres which are located between the source and the drain and each aligned with a respective split in the gate electrode.

6. A semiconductor transistor as claimed in claim 5, wherein the recombination centre or centres are nearer to the drain than they are to the source.

7. A semiconductor transistor as claimed in claim 1, wherein the recombination centre or centres are nearer to the drain than they are to the source.

8. A method of manufacturing the semiconductor transistor of claim 1, comprising the step of depositing the recombination centre on the substrate prior to forming the active layer on the substrate.

9. A method of manufacturing the semiconductor transistor of claim 1, comprising the step of defusing the recombination centre into the active layer.

10. A method of manufacturing the semiconductor of claim 1, comprising the steps of:
    forming at least one recombination centre on a substrate;
    forming a semiconductor layer on the recombination centre and on part of the substrate not covered by the recombination centre;
    forming source and drain regions in the semiconductor layer separate from the recombination centre;
    forming a gate insulating layer on the semiconductor layer; and
    forming a gate electrode on the gate insulating layer.

11. A semiconductor transistor as claimed in claim 1, wherein the recombination centre is spaced at a position of up to about 2 $\mu$m from the drain.

* * * * *

UNITED STATES PATENT AND TRADEMARK OFFICE
CERTIFICATE OF CORRECTION

PATENT NO.    : 6,528,830 B1
DATED         : March 4, 2003
INVENTOR(S)   : Basil Lui et al.

It is certified that error appears in the above-identified patent and that said Letters Patent is hereby corrected as shown below:

<u>Title page,</u>
Insert Item:
-- [30]  Foreign Application Priority Data
Jan. 7, 2000 (GB) ................... 0000380.6 --

Signed and Sealed this

Eleventh Day of November, 2003

JAMES E. ROGAN
*Director of the United States Patent and Trademark Office*